(12) United States Patent
Chang

(10) Patent No.: US 6,867,973 B2
(45) Date of Patent: Mar. 15, 2005

(54) HEAT DISSIPATION DEVICE WITH LIQUID COOLANT

(76) Inventor: Shyy-Woei Chang, 142 Haichaun Rd., Nantzu Chu, Kaohsiung (TW)

( * ) Notice: Subject to any disclaimer, the term of this patent is extended or adjusted under 35 U.S.C. 154(b) by 173 days.

(21) Appl. No.: 10/382,312

(22) Filed: Mar. 5, 2003

(65) Prior Publication Data

US 2004/0184237 A1 Sep. 23, 2004

(51) Int. Cl.⁷ ............................................. H05K 7/20
(52) U.S. Cl. ................... 361/699; 165/80.4; 174/15.1
(58) Field of Search ................... 165/80.4; 174/15.1; 361/687–689, 698–699, 702, 711

(56) References Cited

U.S. PATENT DOCUMENTS

| | | | | |
|---|---|---|---|---|
| 5,646,824 A | * | 7/1997 | Ohashi et al. | 361/699 |
| 5,829,516 A | * | 11/1998 | Lavochkin | 165/80.4 |
| 5,859,763 A | * | 1/1999 | Nam et al. | 361/699 |
| 6,111,749 A | * | 8/2000 | Lamb et al. | 361/699 |
| 6,166,907 A | * | 12/2000 | Chien | 361/699 |

* cited by examiner

*Primary Examiner*—Gregory D. Thompson
(74) *Attorney, Agent, or Firm*—Alan D. Kamrath; Nikolai & Mersereau, P.A.

(57) ABSTRACT

Disclosed is heat dissipation device with circulating liquid coolant. The device comprises a liquid pump; a cooling unit mounted on a heat source of a high power electronic chipset, the cooling unit comprising passages for permitting coolant to pass through, each passage comprising a plurality of recessed and raised portions; a heat sink; and a pipe containing pressurized coolant, the pipe being passed through the liquid pump, the passages of the cooling unit, and the heat sink for forming a closed cooling loop. The recessed and the raised portions in the passage are capable of increasing fluid mixing or turbulence and vortex of coolant, generating a secondary swirling flow by different attack angles of coolant, and generating a chaotic advection at each of a plurality of flow passage when the liquid pump generates the adequate pulsating pressure waves, thereby carrying away heat generated by the high power electronic chipset and circulating coolant through the passages and dissipated at the heat sink.

8 Claims, 6 Drawing Sheets pumping coolant circulating coolant through a cooling unit for absorbing heat from a heat source removing heat from coolant at a heat sink circulating coolant to a liquid pump

HEAT DISSIPATION DEVICE WITH LIQUID COOLANT

FIELD OF THE INVENTION

The present invention relates to heat dissipaters and more particularly to an improved heat dissipation device with liquid coolant circulated therein for removing heat from a high power electronic chipset.

BACKGROUND OF THE INVENTION

It is known that high heat can be generated by an enabled high power electronic chipset (e.g., central processing unit (CPU) of computer). This is particularly true for Pentium series CPUs. A cooler is typically mounted on the top surface of a CPU for removing heat therefrom. However, well known CPU air coolers have suffered certain deficiencies such as low efficiency, bulkiness, and shortened useful life. The typically low values of specific heat and Prandtl number of air have respectively limited the maximum amount of heat dissipation and the convective heat capability when the temperature difference between the maximum operating temperature of the CPU and the ambient temperature remains in a fixed range. A heat dissipater comprising a liquid pump, a cooling unit, a liquid tank, and a set of liquid pipes connecting these components together has been commercially available. In operation, liquid is continuously circulated in the heat dissipater for heat dissipation. However, such technique is disadvantageous for being unreliable and high in cost. Thus, continuing improvements in cooling device for high power electronic chipset are constantly being sought.

SUMMARY OF THE INVENTION

It is therefore an object of the present invention to provide a heat dissipation device comprising a liquid pump for outputting a pressurized liquid coolant; a cooling unit mounted on a heat source of a high power electronic chipset, the cooling unit comprising a plurality of passages for permitting liquid coolant to pass through, each passage comprising a plurality of recessed and raised portions; a heat sink; and a pipe containing pressurized coolant, the pipe being passed through the liquid pump, the passages of the cooling unit, and the heat sink for forming a closed cooling loop, wherein the recessed and the raised portions in the passage are capable of increasing mixing or turbulence and vortex of the coolant, generating a secondary swirling flow by different attack angles of coolant, and generating a chaotic advection at one of a plurality of turbulent flow regions of the passage when the liquid pump generates the adequate pulsating pressure waves, thereby carrying away heat generated by the high power electronic chipset and circulating coolant through the passages and dissipated at the heat sink. The increase of Prandtl number of liquid coolant from the air value also attributes additional benefit in promoting the heat convective capability of the cooling unit.

In one aspect of the present invention, each passage comprises a plurality of alternate recesses of U-shaped and n-shaped sections.

In another aspect of the present invention, each passage comprises a plurality of chambers of rectangular section and a channel formed between two adjacent ones of the chambers.

In still another aspect of the present invention, each passage comprises a plurality of channels and an enlargement between two adjacent ones of the channels.

In still another aspect of the present invention, each passage comprises a plurality of chambers of substantially oval section.

In yet another aspect of the present invention, the pipe is formed of metal or elastomer.

In yet another aspect of the present invention, the passage is capable of substantially preventing coolant from leaking.

In a further aspect of the present invention, the cooling unit is flat for being in close contact with the heat source.

The above and other objects, features and advantages of the present invention will become apparent from the following detailed description taken with the accompanying drawings.

DETAILED DESCRIPTION OF THE PREFERRED EMBODIMENTS

Figure 2:
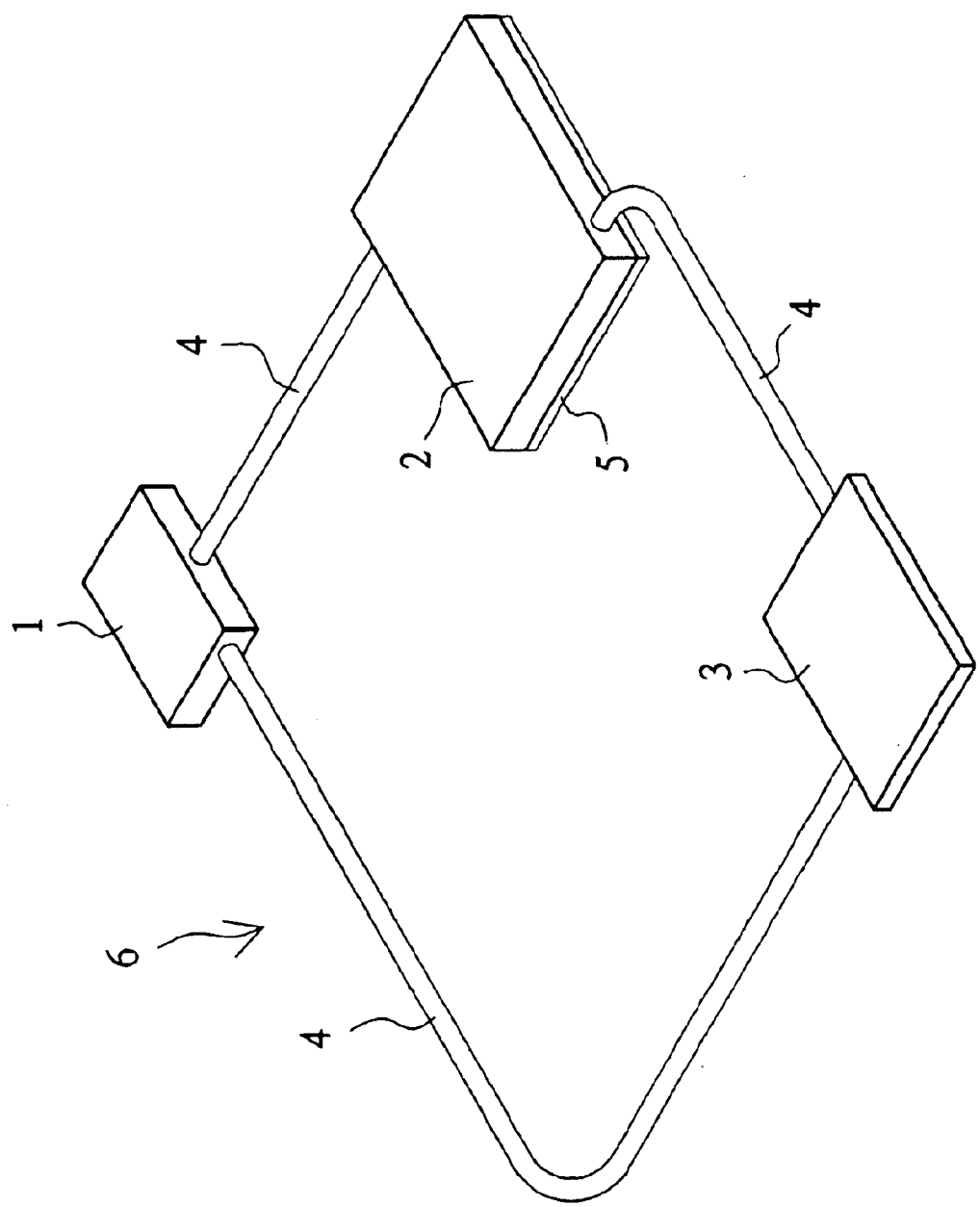
FIG. 2 is a perspective view of the heat dissipation device.

Referring to FIG. 2, there is shown a heat dissipation device 6 constructed in accordance with the invention comprising a liquid pump 1, a cooling unit 2 mounted on a heat source of a high power electronic chipset as detailed later, a heat sink 3, and a pipe 4 containing pressurized coolant, the pipe 4 being passed through the liquid pump 1, the cooling unit 2, and the heat sink 3 for forming a closed cooling system. Preferably, the pipe 4 is formed of metal or elastomer.

Figure 3:
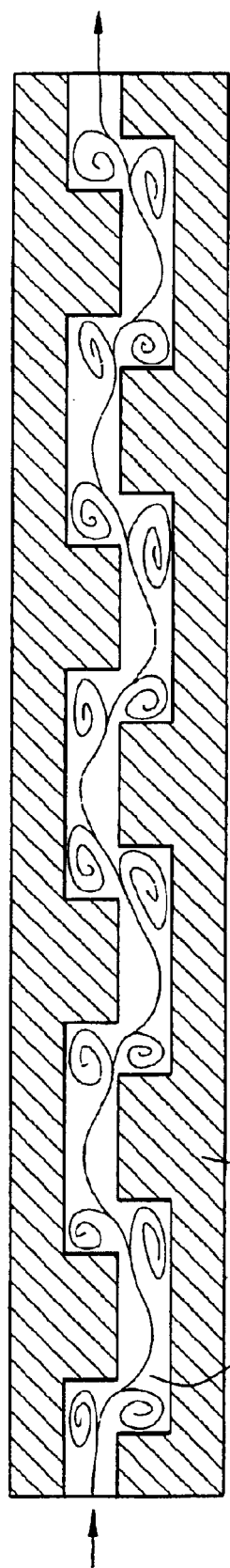
FIG. 3 is a cross-sectional view of passage of a first preferred embodiment of the cooling unit shown in FIG. 2.

Referring to FIG. 3, there is shown a first preferred embodiment of the cooling unit 2. The cooling unit 2 comprises at least one passage 21 each comprising a plurality of alternate recesses of U-shaped and n-shaped sections.

Figure 4:
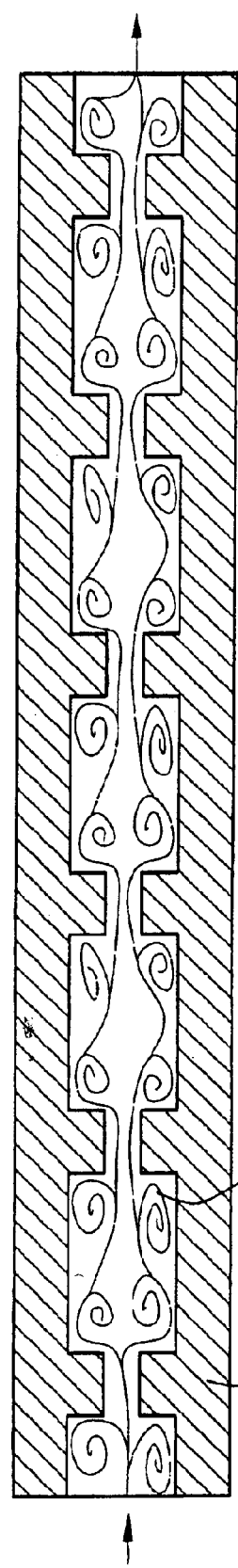
FIG. 4 is a cross-sectional view of passage of a second preferred embodiment of the cooling unit.

Referring to FIG. 4, there is shown a second preferred embodiment of the cooling unit 2. The cooling unit 2 comprises at least one passage 22 each comprising a plurality of chambers of rectangular section in which a channel is formed between any two adjacent chambers.

Figure 5:
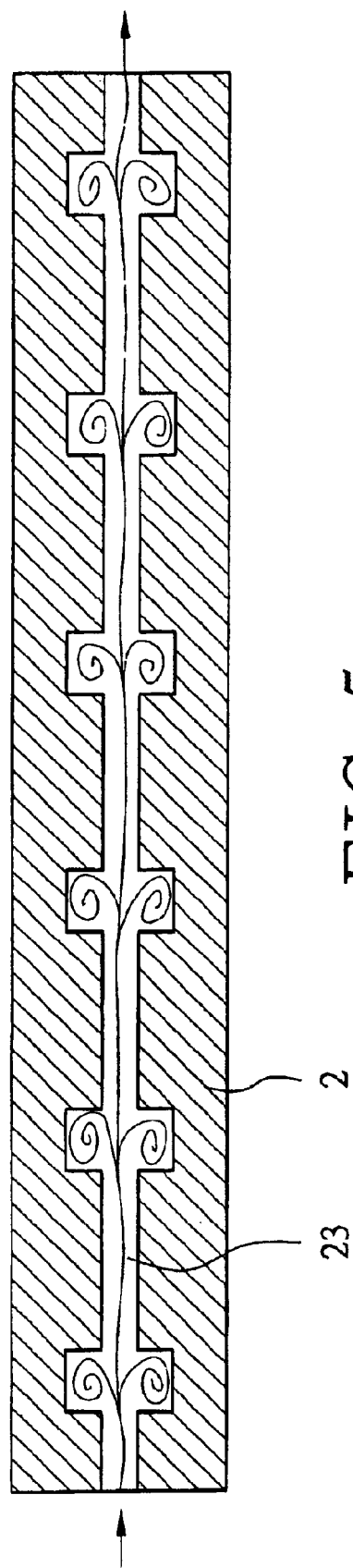
FIG. 5 is a cross-sectional view of passage of a third preferred embodiment of the cooling unit.

Referring to FIG. 5, there is shown a third preferred embodiment of the cooling unit 2. The cooling unit 2 comprises at least one passage 23 each comprising a plurality of channels in which an enlargement is formed any two adjacent channels.

Figure 6:
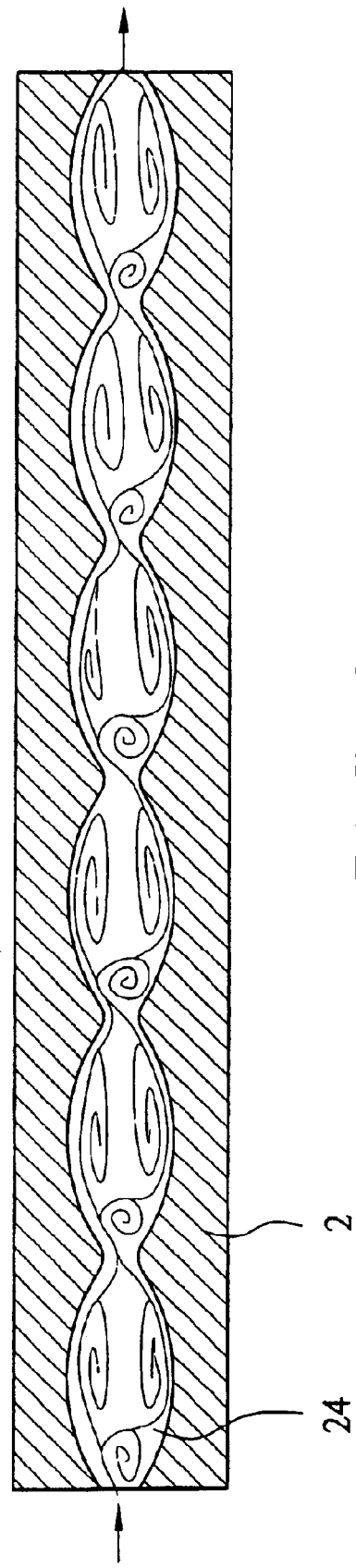
FIG. 6 is a cross-sectional view of passage of a fourth preferred embodiment of the cooling unit.

Referring to FIG. 6, there is shown a fourth preferred embodiment of the cooling unit 2. The cooling unit 2 comprises at least one passage 24 each comprising a plurality of chambers of substantially oval section.

Figure 7:
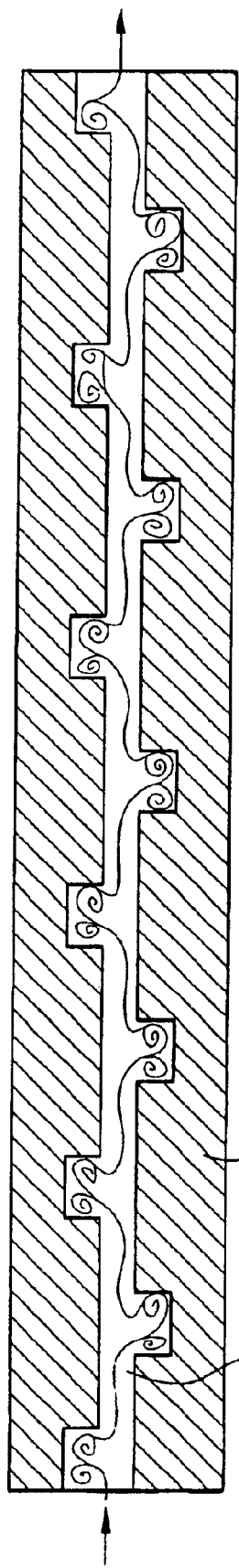
FIG. 7 is a cross-sectional view of passage of a fifth preferred embodiment of the cooling unit.

Referring to FIG. 7, there is shown a fifth preferred embodiment of the cooling unit 2. The cooling unit 2 comprises at least one passage 25 each comprising a plurality of alternate recesses of U-shaped and n-shaped sections. But the recess of the passage 25 is smaller than that of the passage 21. Preferably, the passage is formed of a material capable of substantially preventing coolant from leaking.

The recesses (or the chambers) and raised portions in the passage can increase mixing or turbulence and vortex of coolant flow fed from the liquid pump 1. Also, a secondary swirling flow is generated by different attack angles of the coolant flow. Moreover, a chaotic advection is generated over the enhanced surfaces of the heat dissipation device 6 when the liquid pump 1 generates the adequate pulsating pressure waves. Hence, the heat dissipation efficiency is significantly increased.

Figure 8:
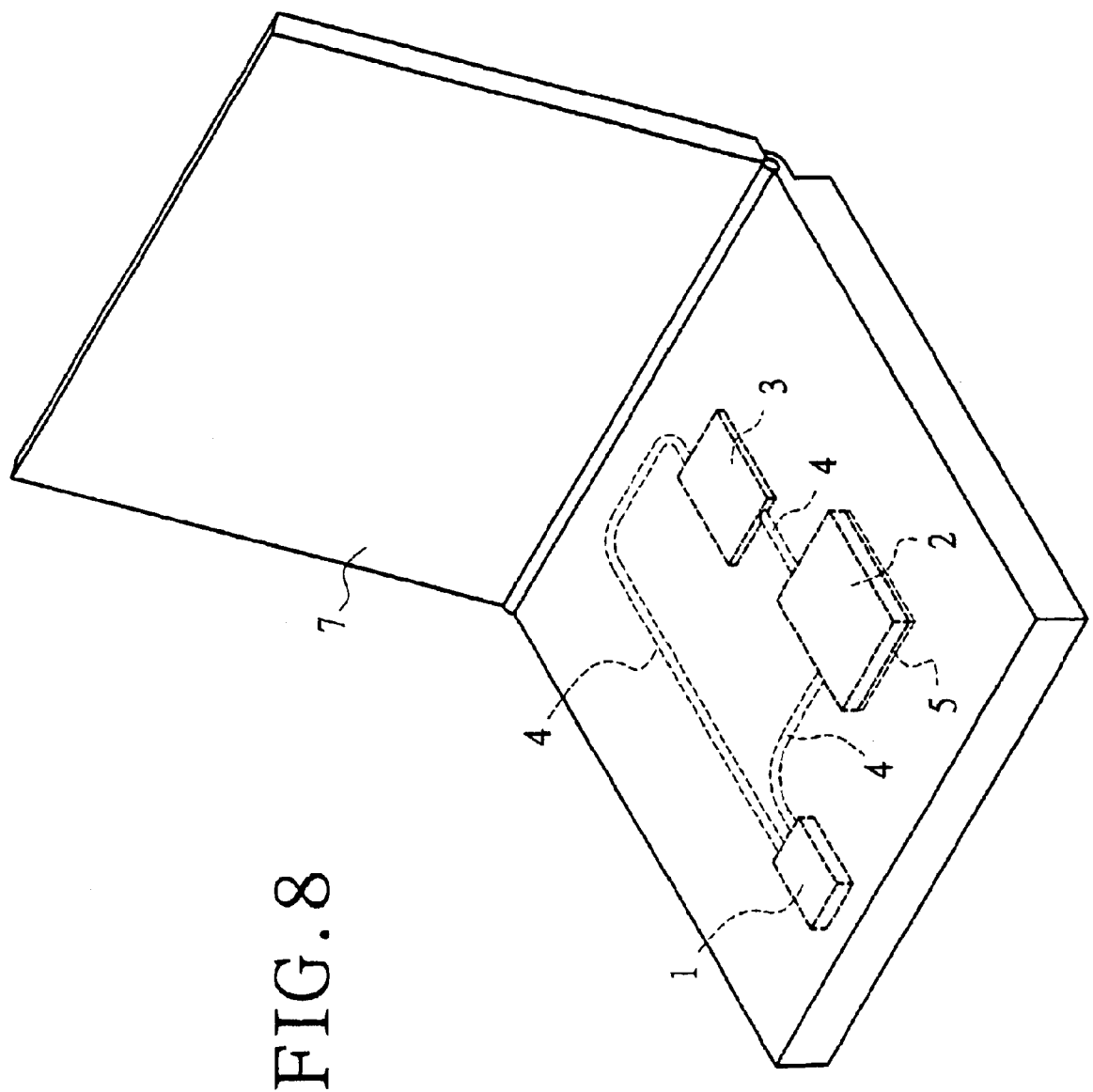
FIG. 8 is a perspective view schematically showing an installation of the heat dissipation device in a notebook computer.

Referring to FIG. 8, there is shown a graph illustrating flow rate versus time for coolant circulated in the pipe 4. It is seen that a pulsating flow, motivated by the liquid pump 1, interacts with the enhanced surfaces could generate a variety of time-varied vortical flow structures, which could lead to the chaotic advection for further heat transfer enhancement.

Figure 9:
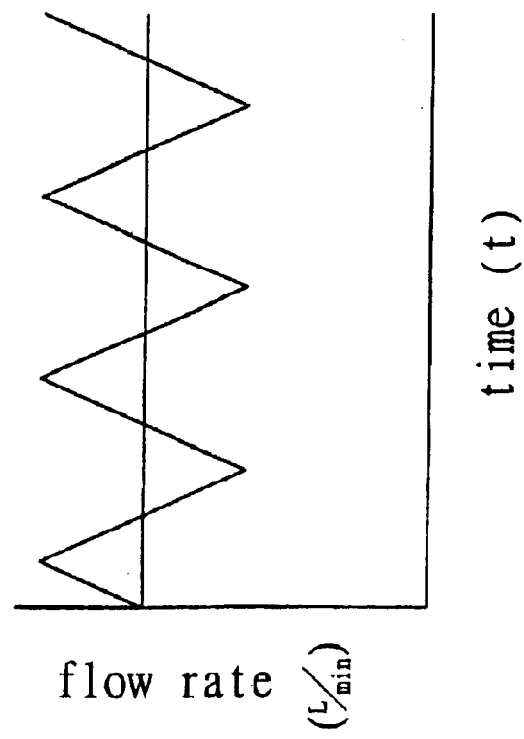
FIG. 9 is a graph illustrating flow rate versus time for coolant circulated in the heat dissipation device.

Referring to FIG. 9, the heat dissipation device 6 can be mounted in a portable electronic device such as a notebook computer 7. As shown, the cooling unit 2 is rested on and is in close contact with a high power electronic chipset (e.g., CPU) 5 of the notebook computer 7. Preferably, the cooling unit 2 is flat for achieving the above purpose of close contact. It is envisaged that high heat generated by the high power electronic chipset 5 can be effectively carried away by the circulating coolant through the passage(s) of the cooling unit 2 and dissipated at the heat sink 3.

Figure 1:
FIG. 1 is a flow chart illustrating heat dissipation process performed by a heat dissipation device according to the invention.
Figure 1:
Figure 1:

Referring to FIG. 1, this flow chart can best illustrate heat dissipation process performed by the heat dissipation device 6. In brief, the process comprises pumping coolant, circulating coolant through the cooling unit 2 for absorbing heat from the heat source, removing heat from coolant at the heat sink, and circulating coolant to the liquid pump 1 for finishing a heat dissipation cycle.

While the invention has been described by means of specific embodiments, numerous modifications and variations could be made thereto by those skilled in the art without departing from the scope and spirit of the invention set forth in the claims.

What is claimed is:

1. A heat dissipation device comprising:
   a liquid pump for outputting pressurized liquid coolant;
   a cooling unit mounted on a heat source of a high power electronic chipset, the cooling unit comprising a plurality of passages for permitting coolant to pass through, each passage comprising a plurality of recessed and raised portions;
   a heat sink; and
   a pipe containing pressurized coolant, the pipe being passed through the liquid pump, the passages of the cooling unit, and the heat sink for forming a closed cooling loop, wherein the recessed and the raised portions in the passages are capable of increasing fluid mixing or turbulence and vortex of coolant, generating a secondary swirling flow by different attack angles of coolant, and generating a chaotic advection at each of the plurality of flow passages when the liquid pump generates the adequate pulsating pressure waves, thereby carrying away heat generated by the high power electronic chipset and circulating coolant through the passages and dissipated at the heat sink.

2. The heat dissipation device of claim 1, wherein each passage comprises a plurality of alternate recesses of U-shaped and n-shaped sections.

3. The heat dissipation device of claim 1, wherein each passage comprises a plurality of chambers of rectangular section and a channel formed between two adjacent ones of the chambers.

4. The heat dissipation device of claim 1, wherein each passage comprises a plurality of channels and an enlargement between two adjacent ones of the channels.

5. The heat dissipation device of claim 1, wherein each passage comprises a plurality of chambers of substantially oval section.

6. The heat dissipation device of claim 1, wherein the pipe is formed of metal or elastomer.

7. The heat dissipation device of claim 1, wherein each passage is capable of substantially preventing coolant from leaking.

8. The heat dissipation device of claim 1, wherein the cooling unit is flat for being in close contact with the heat source.

* * * * *